US006191026B1

(12) United States Patent
Rana et al.

(10) Patent No.: US 6,191,026 B1
(45) Date of Patent: Feb. 20, 2001

(54) METHOD FOR SUBMICRON GAP FILLING ON A SEMICONDUCTOR SUBSTRATE

(75) Inventors: Virendra V. S. Rana; Andrew Conners, both of Los Gatos; Anand Gupta, San Jose; Xin Guo, Mountain View; Soonil Hong, Los Altos, all of CA (US)

(73) Assignee: Applied Materials, Inc., Santa Clara, CA (US)

( * ) Notice: Under 35 U.S.C. 154(b), the term of this patent shall be extended for 0 days.

(21) Appl. No.: 08/584,042

(22) Filed: Jan. 9, 1996

(51) Int. Cl.[7] .................. H01L 21/4763; H01L 21/311; H01L 21/469
(52) U.S. Cl. .................. 438/624; 438/694; 438/697; 438/710; 438/723; 438/784; 438/787
(58) Field of Search .................. 438/784, 694, 438/624, 695, 763, 697, 710, 723, 787; 427/584, 255, 579, 578

(56) References Cited

U.S. PATENT DOCUMENTS

| 4,892,753 | 1/1990 | Wang et al. | 427/38 |
|---|---|---|---|
| 4,960,488 | 10/1990 | Law et al. | 156/643 |
| 5,013,691 | 5/1991 | Lory et al. | 437/238 |
| 5,089,442 | 2/1992 | Olmer | 432/235 |
| 5,279,865 | 1/1994 | Chebi et al. | 427/574 |
| 5,302,233 | 4/1994 | Kim et al. | 156/636 |
| 5,416,048 | 5/1995 | Blalock et al. | 437/228 |
| 5,492,736 | * 2/1996 | Laxman et al. | 427/579 |
| 5,599,740 | 2/1997 | Jang et al. | 437/190 |
| 5,719,085 | 2/1998 | Moon et al. | 438/424 |
| 5,827,785 | * 10/1998 | Bhan et al. | 438/784 |
| 5,850,105 | 12/1998 | Dawson et al. | 257/758 |
| 5,869,149 | * 2/1999 | Denison et al. | 427/579 |
| 5,872,052 | 2/1999 | Iyer | 438/622 |
| 5,872,065 | * 2/1999 | Sivaramakrishnan | 438/784 |
| 5,908,672 | * 6/1999 | Ryu et al. | 427/574 |
| 5,935,649 | * 8/1999 | Koizumi et al. | 427/255.3 |
| 5,937,323 | * 8/1999 | Orczyk et al. | 438/624 |

OTHER PUBLICATIONS

U.S. application No. 08/344,283, Mizuno, filed Nov. 22, 1994.
T. Abraham, "Reactive Facet Tapering of Plasma Oxide for Multilevel Interconnect Applications," *IEEE—V–MIC Conference Jun. 15–16, 1987*, pp. 115–121 (Jun. 1987).
B. Lee et al., "Dielectric Planarization Techniques For Narrow Pitch Multilevel Interconnects," *IEEE—V–MIC Conference Jun. 15–16*, 1987, pp. 85–92 (Jun. 1987).

* cited by examiner

*Primary Examiner*—John F. Niebling
*Assistant Examiner*—Ha Tran Nguyen
(74) *Attorney, Agent, or Firm*—Townsend & Townsend & Crew

(57) ABSTRACT

A semiconductor manufacturing process with improved gap fill capabilities is provided by a three step process of FSG deposition/etchback/FSG deposition. A first layer of FSG is partially deposited over a metal layer. An argon sputter etchback step is then carried out to etch out excess deposition material. Finally, a second layer of FSG is deposited to complete the gap fill process.

19 Claims, 8 Drawing Sheets

METHOD FOR SUBMICRON GAP FILLING ON A SEMICONDUCTOR SUBSTRATE

BACKGROUND OF THE INVENTION

The present invention relates to the deposition of dielectric layers in wafer processing during the manufacture of an integrated circuit. More specifically, the present invention relates to a method and apparatus for forming a conformal silicon oxide thin film over a stepped or non-planar surface of a semiconductor wafer or substrate.

Interconnections on semiconductor devices are typically made by metal conductors, which in some cases are narrow, closely spaced metal lines. The use of two or more levels of metal conductors requires the need for a deposition of an insulating layer between the layers of metal to avoid a short circuit between conductors or another anomalies.

Thus, one of the primary steps in the fabrication of modern multilevel semiconductor devices is the formation of these insulating layers, which are also referred to as intermetal dielectric layers, or IMD layers. One of the primary methods of forming IMD layers on a semiconductor substrate is by chemical reaction of gases. Such a deposition process is referred to as chemical vapor deposition or "CVD". Conventional thermal CVD processes supply reactive gases to the substrate surface where heat-induced chemical reactions take place to produce a desired film. The high temperatures at which some thermal CVD processes operate can damage device structures having metal layers. Plasma enhanced CVD (frequently referred to as PECVD) processes on the other hand, promote excitation and/or dissociation of the reactant gases by the application of radio frequency (RF) energy to a reaction zone typically proximate the substrate surface, thereby creating a plasma of highly-reactive species. The high reactivity of the released species reduces the energy required for a chemical reaction to take place, and thus lowers the required temperature for such CVD processes. The relatively low temperature of a PECVD process makes such processes ideal for the formation of insulating layers over deposited metal conductors. $SiO_2$ is a common IMD layer.

Semiconductor device geometries have dramatically decreased in size since such devices were first introduced several decades ago. Since then, integrated circuits have generally followed the two year/half-size rule (often called "Moore's Law") which means that the number of devices which will fit on a chip doubles every two years. Today's wafer as fabrication plants are routinely producing 0.5 and even 0.35 micron feature size devices, and tomorrow's plants soon will be producing devices having even smaller geometries.

As circuit densities increase, the spacing between adjacent metal conductors decreases, which causes an increase in the ratio of the height of adjacent conductors to their separation, commonly referred to as the aspect ratio. An increase in the aspect ratio is accompanied by an increase in the likelihood that a deposited insulating layer will not conform to and completely fill the gap between conductors. Thus, as an insulating layer is deposited, an undesirable void may form within the layer between adjacent conductors. A void can form when the deposits on the upper portion of adjacent metal vertical side walls contact each other before the bottom of the gap fills in.

One solution to this problem has involved depositing $SiO_2$ derived from a precursor gas containing tetraethoxysilane (TEOS) $(Si(OC_2H_5)_4)$. An $SiO_2$ layer formed from TEOS is referred to hereinafter as a TEOS deposition or insulating layer.

Another solution has been, instead of depositing an $SiO_2$ insulating layer formed from TEOS, to deposit fluorine-doped silicon oxide films, which are also referred to as fluoro silicate glass films (FSG). Because fluorine is an etching species, fluorine doping introduces a simultaneous deposition/etch effect, where excess deposition layer is etched away, improving the gap fill. The simultaneous etch slows the deposition on the top of the sidewalls, so that the bottom of the gap can fill more before the top closes off.

Another solution has been, rather than performing a one-step deposition of an insulating layer between metal conductors, to perform a three-step process of TEOS deposition/etchback/TEOS deposition. In this three-step process, a TEOS insulating layer is partially deposited over a metal layer. Then, an etchback step is performed that etches away some of the excess silicon oxide that might cause an uneven deposition of further oxide layers, leading to void formation. The etchback removes some of the deposits at the top of the gap, keeping it from closing off too soon. Finally, the TEOS deposition is completed in the third step. The three step TEOS deposition/etchback/TEOS deposition process provides gap fill capabilities that are an improvement over performance of the one step TEOS deposition process.

With the shrinking semiconductor device sizes, as noted above, the gap widths between adjacent conductors are falling to below 0.5 micron. Thus, it would therefore be desirable to be able to deposit an insulating layer over a metal layer that has an gap fill capability for a higher aspect ratio, such as 2.0, for example.

SUMMARY OF THE INVENTION

The present invention provides improved gap fill capabilities with a three step process of fluoro silicate glass deposition/etchback/fluoro silicate glass deposition. A first layer of fluoro silicate glass (FSG) is partially deposited over a metal layer. A sputter etchback step is then carried out to etch out excess deposition material. Finally, a second layer of FSG is deposited to complete the process and fill in the remainder of the insulating layer. The invention thus combines the simultaneous etch/deposition approach with a separate etchback and deposition approach to provide a gap fill improvement that is better than either approach alone.

DESCRIPTION OF THE PREFERRED EMBODIMENT

I. Exemplary CVD Reactor and Etchback Chambers

A. Exemplary CVD Reactor Chamber

Figure 1A:
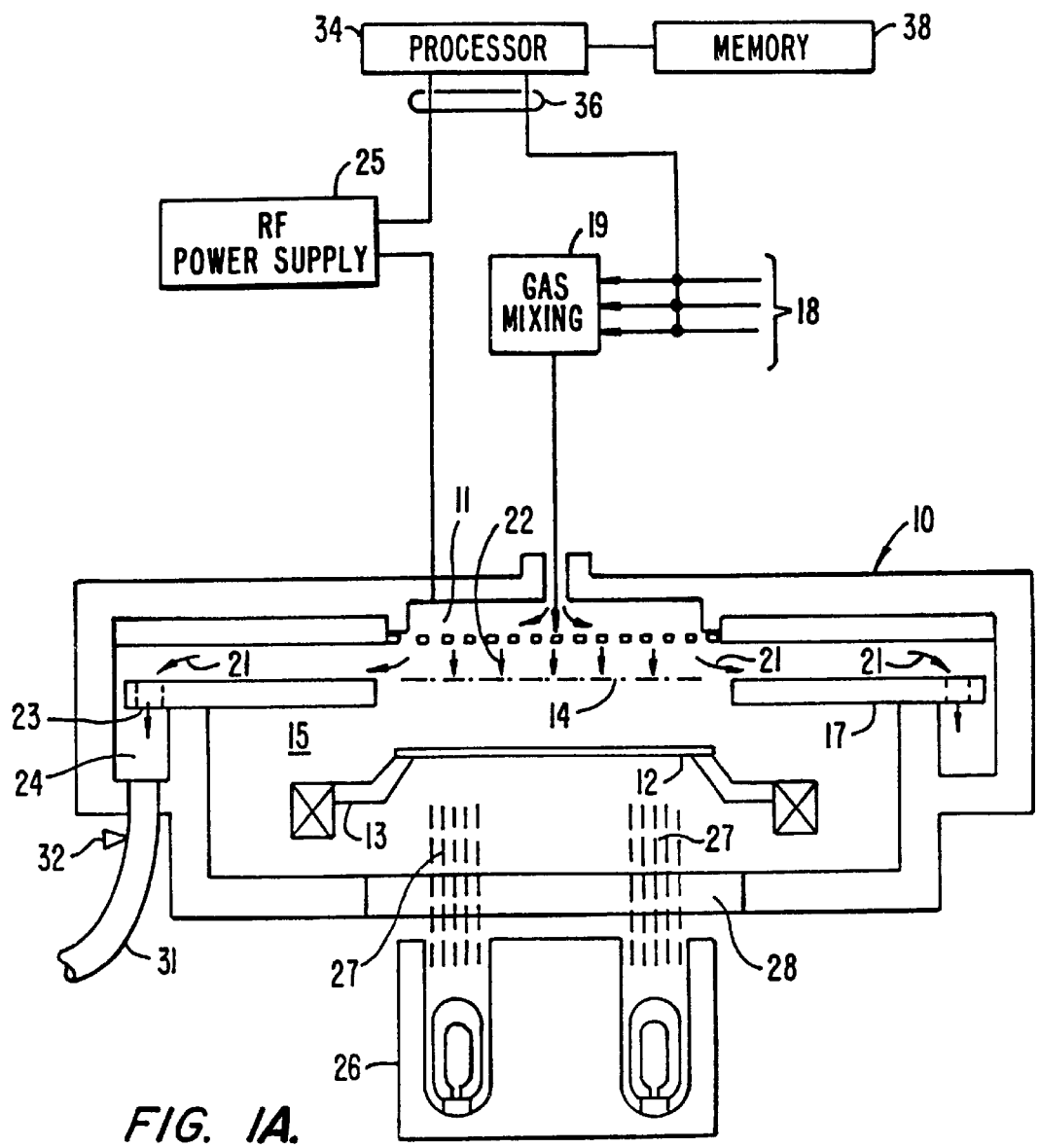
FIG. 1A is a vertical, cross-sectional view of one embodiment of a simplified chemical vapor deposition apparatus.

FIG. 1A illustrates one embodiment of a simplified, parallel plate plasma enhanced chemical vapor deposition (PECVD) reactor 10 having a vacuum chamber 15 in which the insulating layer can be deposited according to the present invention. Reactor 10 contains a gas distribution manifold 11 for dispersing deposition gases to a wafer, not shown, that rests on a susceptor 12. Susceptor 12 is highly thermally responsive and is mounted on supports 13 so that susceptor 12 (and the wafer supported on the upper surface of susceptor 12) can be controllably moved between a lower loading/off-loading position and an upper processing position 14 which is closely adjacent manifold 11.

When susceptor 12 and the wafer are in processing position 14, they are surrounded by a baffle plate having a plurality of spaced holes 23 which exhaust into an annular vacuum manifold 24. Deposition and carrier gases and liquids are supplied through lines 18, having control valves not shown, into a gas mixing chamber 19 where they are combined and then sent to manifold 11. During processing, gas inlet to manifold 11 is vented toward and uniformly distributed radially across the surface of the wafer as indicated by arrows 22 and 21. The gas is then exhausted via ports 23 into the circular vacuum manifold 24 and out an exhaust line 31 by a vacuum pump system (not shown). The rate at which gases are released through exhaust line 31 is controlled by a throttle valve 32.

A controlled plasma is formed between electrodes by RF energy applied to manifold 11 from RF power supply 25. Gas distribution manifold 11 is also an RF electrode, while susceptor 12 is grounded. RF power supply 25 can supply either single or mixed frequency RF power (or other desired variation) to manifold 11 to enhance the decomposition of reactive species introduced into chamber 15.

A circular external lamp module 26 provides a collimated annular pattern of light 27 through quartz window 28 onto susceptor 12. Such heat distribution compensates for the natural heat loss pattern of the susceptor and provides rapid thermal and uniform susceptor and wafer heating for effecting deposition. It should of course be understood that the heat distribution could also be provided by other methods, such as, for example, resistive heating.

A motor, not shown, raises and lowers susceptor 12 between a processing position 14 and a lower, wafer-loading position. The motor, control valves connected to lines 18, throttle valve and RF power supply 25 are controlled by a processor 34 over control lines 36 of which only some are shown. Processor 34 operates under the control of a computer program stored in a memory 38. The computer program dictates the timing, mixture of gases, chamber pressure, chamber temperature, RF power levels, susceptor position, and other parameters of a particular process.

Typically, any or all of the chamber lining, gas inlet manifold faceplate, support fingers 13, and various other reactor hardware is fabricated from material such as anodized aluminum. An example of such a PECVD apparatus is described in U.S. Pat. No. 5,000,113 entitled "Thermal CVD/PECVD Reactor and Use for Thermal Chemical Vapor Deposition of Silicon Dioxide and In-situ Multi-step Planarized Process," which is commonly assigned.

The above reactor description is mainly for illustrative purposes and should not be considered as limiting the scope of the present invention. Variations of the above described reactor such as variations in susceptor design, heater design, location of RF power connections and others are possible. Additionally, other plasma CVD equipment such as electron cyclotron resonance (ECR) plasma CVD devices, induction coupled RF high density plasma CVD devices, or the like may be employed. Additionally, thermal CVD equipment may also be used for formation of the halogen-doped bulk film layer. The dielectric layer and method for forming such a layer of the present invention is not limited to any specific apparatus or to any specific plasma excitation method.

B. Exemplary Etchback Chamber

Figure 1B:
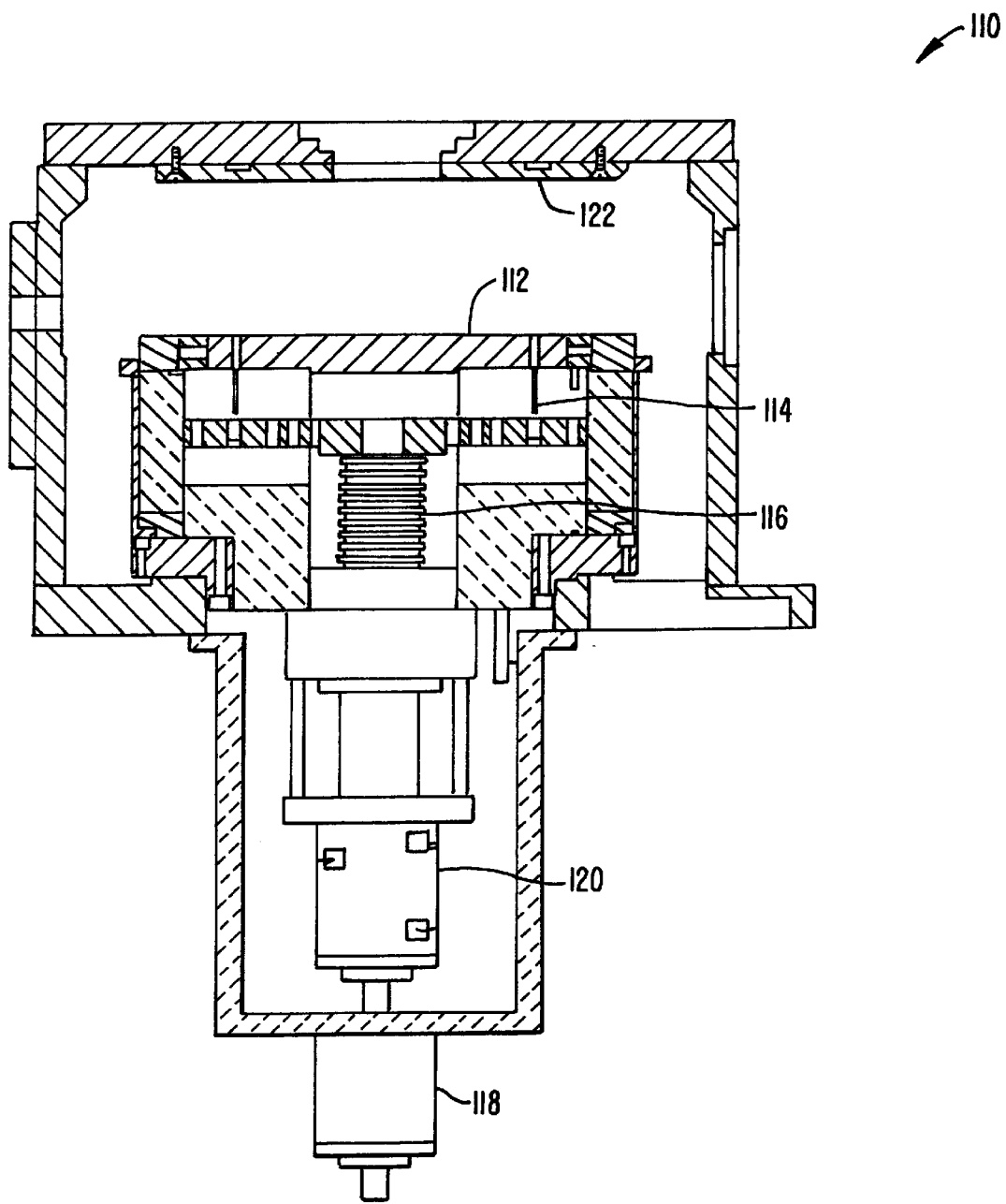
FIG. 1B is a cross-sectional view of one embodiment of a simplified etchback chamber.

FIG. 1B shows a cross-sectional view of one embodiment of a simplified etchback chamber 110 in which a sputter etchback step may be carried out according to the present invention.

A semiconductor wafer undergoing the sputter etchback step in etchback chamber 110 sits upon pedestal 112. Lift finger 114 raises and lowers the wafer to and from the pedestal surface. Bellows 116 transfers motion from a lift cylinder 118 to lift finger 114 while maintaining the vacuum integrity of the process chamber. Bellows 116 moves upward by pneumatic expansion of lift cylinder 118. A return spring in a lift actuator 120 causes downward movement. Lift cylinder 118 pneumatically drives bellows 116 and moves lift finger 114 to three possible positions: Process, Release or Lift. Three sensors and one flag define position reference points. The position sensors are on adjustable slide mounts. Lift actuator 120 lowers lift finger 114 with a return spring and transfers upward motion of lift cylinder 118 to bellows 116.

The sputter etch process chamber 110 encloses the etch processing environment. Four types of applications are possible in chamber 110 to perform the etchback step on a semiconductor wafer: sputter etch, RIE (reactive ion etch), doped sputter etch, and magnetically enhanced sputter etch or RIE.

The sputter etch chamber may be used for planarization of dielectric and metal films. In a sputter etch process, inert gas such as Argon is fed into the etch chamber 110 through a gas distribution plate 122, while a throttle valve controls the pumping rate until the desirable pressure is reached (typically 1 mTorr to 700 mTorr). A radio frequency (RF) power is supplied to the cathode/pedestal where the wafer is placed. The RF power accelerates electrons back and forth, causing ionization of the gas molecules and forming a plasma state. In addition, the RF power induces a negative self bias voltage on the wafer due to the higher mobility of the negative charged electrons in the plasma. The negative voltage attracts and accelerates ions, so that the ions collide with the surface of the wafer, causing sputtering of the atoms from the surface of the wafer. The wafer is thus etched by the sputter removal of surface atoms.

In a reactive ion etch process, the plasma is generated in a similar method as sputter etch, except chemicals such as $CF_4$ and/or $CHF_3$ which are fed into the chamber 110. Plasma breaks up the chemical molecules, forming highly reactive radicals (such as F and $CF_3$). These radicals react with the surface atoms on the wafer such as Si and $SiO_2$, forming volatile compounds that are pumped away. In addition, the ion bombardment on the wafer enhances the chemical reaction rate and increases the etch rate on the wafer surface.

Doped sputter etch combines the sputter etch with reactive ion etch by doping the argon gas with a small amount of reactive gas (such as $CF_4$). The wafer surface removal is accomplished by both sputtering and chemical reactions. The etch rate is enhanced by the surface chemical reaction in addition to the sputter etch process.

In magnetically enhanced sputter etch or RIE, a magnetic field confines electrons in the plasma, reducing the loss of energetic electrons to the chamber wall. This results in a higher density plasma. The higher density plasma reduces the wafer bias voltage for a given RF power and allows a lower operating pressure for a given wafer bias voltage. A magnetic field is often used in the etch chamber for these reasons.

II. Illustration of Voids in Deposition Layer

Figure 2:
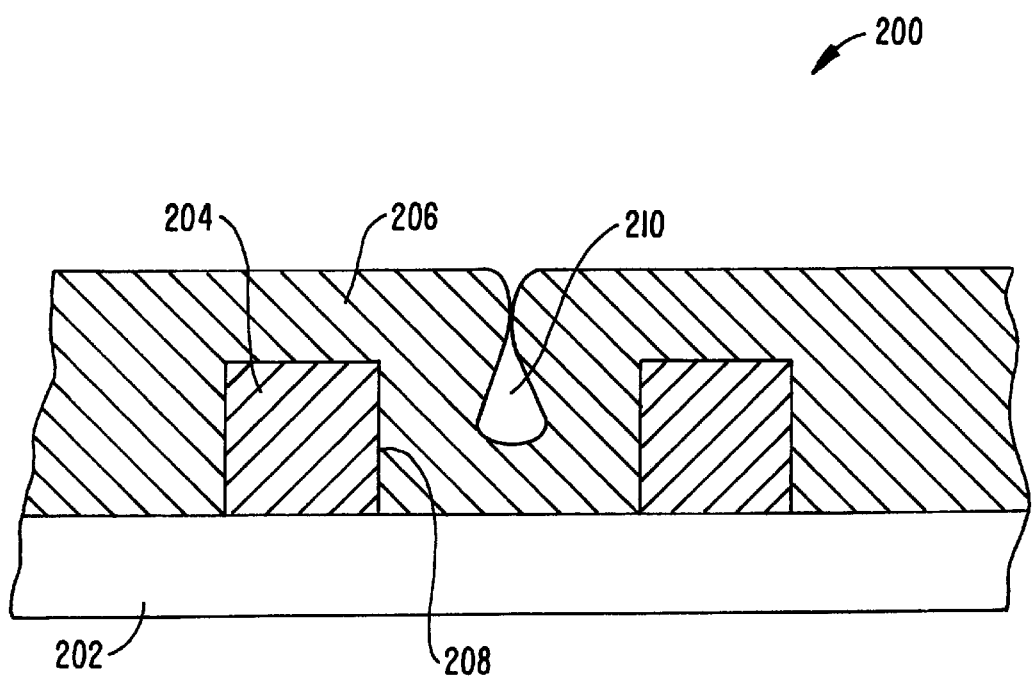
FIG. 2 shows a simplified cross-sectional view of an insulating silicon oxide deposited over metal conductors where voids have formed in the deposition layer.

FIG. 2 shows a cross-section schematic view 200 of an insulating silicon oxide deposited over metal conductors where voids have formed in the deposition layer. Semiconductor layer 202 supports a layer of metal conductors 204. Silicon oxide 206 is deposited as an insulating layer over metal conductors 204. Again, the aspect ratio is defined as the ratio of the height of vertical sidewall 208 of a metal conductor 204 to the spacing between adjacent conductors. As discussed above, using prior art deposition techniques for higher aspect ratios, the deposited silicon oxide on adjacent vertical sidewalls 208 tends to grow together. The corners of the deposited layer will meet first, which results in voids 210 forming in the silicon oxide layer. Voids in the insulating layer should be avoided because, for example, they trap undesired impurities that can affect device operation.

Therefore, to improve the step coverage of the deposited conformal silicon oxide film, the present invention is directed to a three step FSG deposition/etchback/FSG deposition process.

III. FSG Deposition/Etchback/FSG Deposition Process

Figure 3:
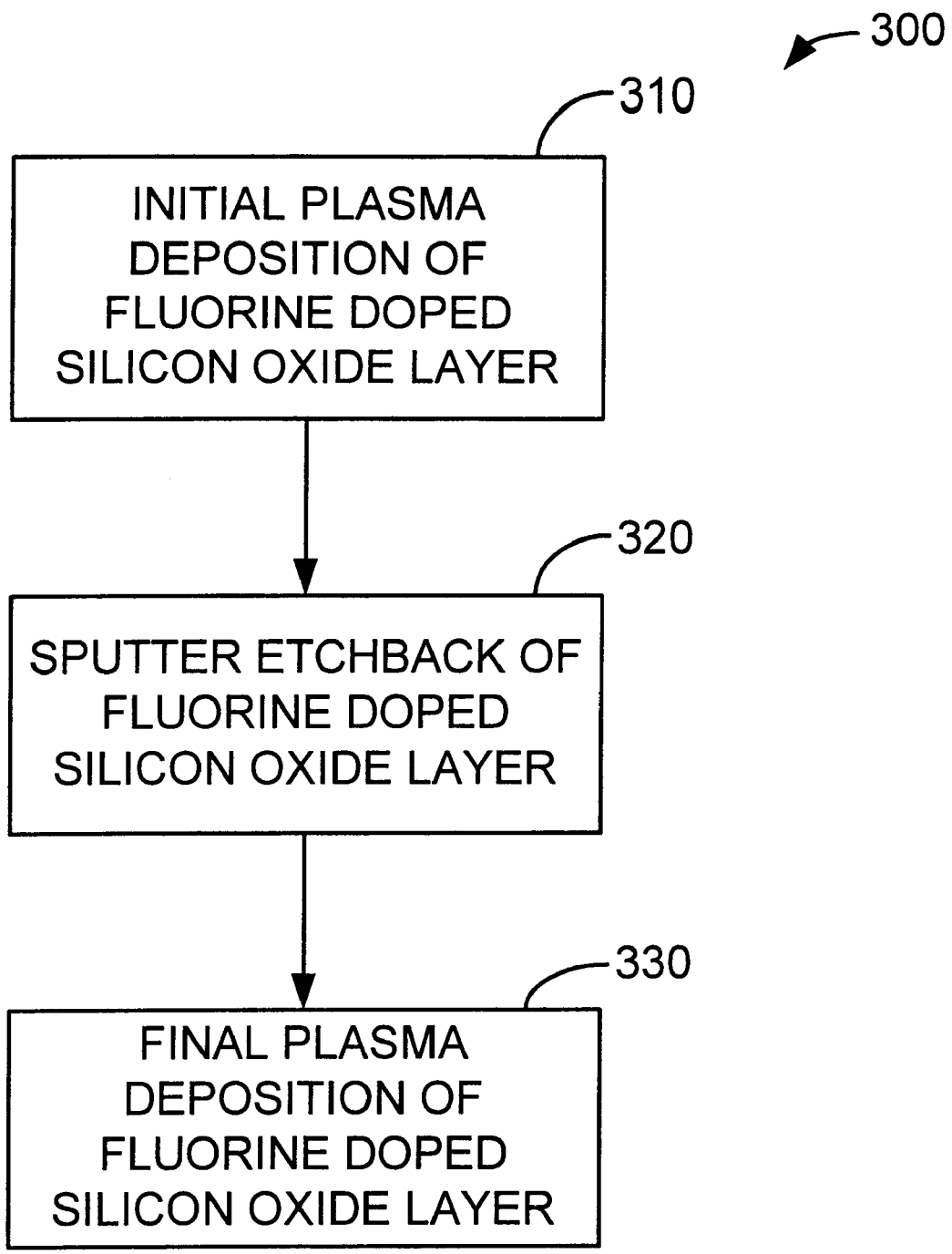
FIG. 3 shows a flowchart illustrating the three-step FSG deposition/etchback/FSG deposition process of the present invention.

FIG. 3 shows a flowchart illustrating the three-step FSG deposition/etchback/FSG deposition process 300 of the present invention.

In step 310, an initial deposition of a fluorine doped silicon oxide layer is made on a semiconductor substrate to partially fill the gap between metal conductors. In one embodiment, the initial deposition of a fluorine doped silicon oxide layer may be preceded by a brief deposition of an undoped silicate glass (USG) on the substrate. The undoped silicate glass layer prevents the reaction, if any, between the fluorine in the FSG layer and the metal conductors before using the simultaneous etch/deposition of FSG to control the closure of the top of the gap. In a preferred embodiment, the process step is carried out in a PECVD deposition chamber shown in FIG. 1A, for example. The initial deposition must be cut off at a point where the silicon oxide layer covers the corners of the metal conductors, but has not become so thick that the sidewalls have become reentrant. A preferred initial deposition process step will be described in further detail below.

In step 320, an etchback step is carried out to etch away a portion of the initial silicon oxide deposition layer. In a preferred embodiment, after an initial deposition is made on the semiconductor substrate in step 310, the substrate is removed from the deposition chamber and placed in an etchback chamber, such as the one shown in FIG. 1B, for example. It should be understood that, in a preferred embodiment, the substrate is transported under vacuum seal from the deposition chamber to the etchback chamber. A certain portion of the deposition layer that covers the corners of the metal conductors is etched away so that the profile of the remaining deposition layer is not as conducive to the formation of voids as with prior art processes. Specifically, argon is introduced into the etchback chamber to etch away some of the deposition layer above the conductor corners so that angles are formed in the deposition profile, leading to improved gap fill in the succeeding deposition step. A preferred sputter etchback step will be described in further detail below.

In step 330, a final deposition of a fluorine doped silicon oxide layer is made on the semiconductor substrate to fill the remaining insulating layer over the metal layer of conductors. In a preferred embodiment, the process step is again carried out in a PECVD deposition chamber shown in FIG. 1A, for example. The final deposition provides a more conformal insulating layer over the conductors because the angles formed in the etching step of step 320 allow the silicon oxide to fill the gap more completely without forming voids. A preferred final deposition process step will be described in further detail below.

IV. Initial FSG Deposition Step

According to the process of the present invention, the bulk of a fluorine doped silicon oxide layer may be formed using any of several different processes.

The process recipes of three FSG films, one using $SiF_4$ as a fluorine source, one using triethoxyfluorosilane (hereinafter referred to as "TEFS") as a fluorine source and one using $C_2F_6$ as a fluorine source, are set forth below as examples. These process recipes are also discussed in commonly-assigned applications Ser. No. 08/538,696, filed Oct. 2, 1995, and Ser. No. 08/548,391, filed Oct. 26, 1995, both of which are hereby incorporated by reference. The fluorine doped silicon oxide layer can also be deposited using other fluorine dopants such as, for example, $NF_3$ or FASI-4.

The exemplary processes may be performed in PECVD reactor 10 (FIG. 1). Of course, those of ordinary skill in the art would understand that other process recipes and other reaction chamber types may also be used to deposit the bulk FSG films.

A. SiF4-FSG Film Deposition

Referring to FIG. 1, the exemplary $SiF_4$-FSG film is deposited according to the present invention by loading the wafer in vacuum chamber 15 through a vacuum-lock door and placed onto susceptor 12. The susceptor is then moved into processing position 14. In processing position 14, the wafer is positioned between about 200–600 mils from gas distribution manifold 11.

Once the wafer is properly positioned, the wafer and susceptor are heated to a temperature of between 200–500° C. and a process gas is introduced into the reaction chamber from the gas distribution manifold. The process gas is a gaseous mixture comprising $SiF_4$ as the gaseous source of fluorine, TEOS as the source of silicon, and one or more gaseous sources of oxygen.

TEOS, which is in liquid form at room temperature, is vaporized by a liquid injection valve or the like and combined with an inert carrier gas such as helium. The flow rate of TEOS into the injection valve is between about 400–1500 mgm. After being vaporized, the TEOS gas source is mixed with a helium carrier gas introduced at a rate of between 400–1500 sccm. $SiF_4$ is introduced at a flow rate of between 100–2500 sccm, while oxygen in the form of $O_2$ or a similar source is introduced at a rate of between about 300–3000 sccm. The total gas flow into the gas mixing chamber and through the gas distribution manifold is between about 1000 and 5000 sccm. A selected pressure of between about 1–100 torr in the reaction chamber is set and maintained throughout deposition by throttle valve 32 in conjunction with the vacuum pump system and the introduction of the process gas. After processing conditions are set, a plasma is formed using a single or mixed frequency RF power supply. The power supply is driven at a high frequency of 13.56 MHz at between 0–1200 Watts and at a low frequency of about 350 KHz at between about 0–500 Watts.

The above process parameters are appropriate for a wafer size of 200 mm. It should be understood by one skilled in the art that all values will scale accordingly for different wafer sizes.

Other silicon and oxygen sources can be used in conjunction with $SiF_4$ to form an $SiF_4$-FSG film according to the present invention. For example, silane ($SiH_4$) and $N_2O$ are an acceptable combination. TEOS ($Si(OC_2H_5)_4$), however, is the source of silicon used in a preferred embodiment of the present invention because $SiF_4$-FSG films deposited with TEOS are more conformal, have better gap fill properties and can be deposited at increased deposition rates. Of course other organic silanes such as tetramethyl silane ($Si(CH_3)_4$), hexamethyl disiloxane (($CH_3)_6OSi_2$) or the like may be used as a silicon containing source.

B. TEFS-FSG Film Deposition

The exemplary TEFS-FSG bulk film is deposited by heating the wafer and susceptor to a temperature of between 200–500° C., preferably to a temperature within the range of 350–500° C. and most preferably to about 400 degrees, and maintaining this temperature range throughout the deposition. The reaction chamber is maintained at a pressure within a range of about 1–50 torr. Preferably, the pressure is maintained within the range of about 3–16 torr, and most preferably it is maintained at about 5 torr. The susceptor is positioned about 200–600 mils from the gas distribution manifold and is preferably positioned about 250 mils from the manifold.

A mixture comprising TEFS as the source of fluorine, TEOS as the source of silicon and one or more gaseous sources of oxygen is formed. Being liquids, the TEFS and TEOS sources are vaporized and then combined with an inert carrier gas such as helium. The flow rate of TEFS is between about 200–1500 mgm and is preferably between about 300–900 mgm and is most preferably at about 500 mgm, while the TEOS flow rate is between about 400–1500 mgm and preferably about 500 mgm. The vaporized TEOS and TEFS gases then are mixed with a helium carrier gas flowing at a rate of between 400–1500 sccm and are preferably flowing at a rate of about 560 sccm. Oxygen in the form of $O_2$ is introduced at a flow rate of between about 100–5000 sccm and is preferably introduced at a flow rate of about 1200 sccm. This mixture is introduced into the reaction chamber from the gas distribution manifold and excited into a plasma state. The plasma is formed using a frequency of 13.56 MHz at between 0–500 Watts, and preferably at about 155 Watts, and a low radio frequency of between 10 KHz to 2 MHz, preferably about 350 KHz powered at between about 0–900 Watts and preferably at about 230 Watts.

The ratio of TEFS to TEOS is between 0.33–10:1 and preferably between about 1–3:1. The total flow rate of all gaseous sources is between 500–6500 sccm and is preferably between about 1500–2500 sccm.

The above conditions result in an FSG film deposited at a rate of between 3000–7000 Å/minute having a compressive stress level of between −0.5 to −3.0*10$^9$ dynes/cm$^2$, a wet etch ratio with respect to the thermal oxide film of between 3–5 for 6:1 BOE etchant and an atomic fluorine concentration of between 0.5–15. Preferably, the fluorine concentration of the resulting film is between 0.5–6% SiF as measured by Fourier transform infrared (FTIR) spectroscopy of the peak ratio of SiF bonds to SiF+SiO bonds. Most preferably the fluorine concentration of the resulting film is between 1.0–4.0% SiF.

The above process parameters are appropriate for a wafer size of 200 mm. It should be understood by one skilled in the art that all values will scale accordingly for different wafer sizes.

C. $C_2F_6$-FSG Film Deposition

The exemplary $C_2F_6$-FSG bulk film is deposited by heating the wafer and susceptor to a temperature of between 200–500° C., preferably to a temperature within the range of 350–500° C. and most preferably to about 400 degrees, and maintaining this temperature range throughout the deposition. Electrode spacing ranges from about 200–600 mils, and is preferably at about 250 mils.

A gaseous mixture comprising $C_2F_6$ as the gaseous source of fluorine, TEOS as the source of silicon, and one or more gaseous sources of oxygen is introduced into the reaction chamber from the gas distribution manifold and an RF plasma is formed. The plasma is formed using a high radio frequency of 13.56 MHz at between 0–500 Watts, and preferably at about 200 Watts, and a low radio frequency of between 10 KHz to 2 MHz, preferably about 350 KHz at between about 0–900 Watts and preferably at about 430 Watts.

The TEOS source is first vaporized and then combined with an inert carrier gas such as helium. The flow rate of TEOS is between about 400–1500 mgm and preferably at a rate of about 600 mgm. After being vaporized, the TEOS gas source then is mixed with a helium carrier gas at a rate of between 400–1500 sccm and preferably at a rate of about 760 sccm. $C_2F_6$ is introduced at a flow rate of between 100–900 sccm and is preferably introduced at a rate of about 400 sccm. Oxygen in the form of $O_2$ is introduced at a rate of between about 100–5000 sccm and preferably at a rate of about 1200 sccm.

The reaction chamber is maintained at a pressure within a range of about 1–50 torr, preferably at a pressure within the range of about 3–16 torr and most preferably at a pressure of about 5 torr. The ratio of $C_2F_6$ to TEOS is between about 1–25:1 and preferably between about 5–15:1. While the total flow rate of all gaseous sources is between 500–6200 sccm and is preferably between about 2000–3000 sccm.

The above process conditions result in an FSG film deposited at a rate of between 3000–6000 Å/minute having compressive a stress level of between 0 to −2.0*10$^9$ dynes/cm$^2$, a wet etch ratio with respect to the thermal oxide film of between 3–5 for 6:1 BOE etchant and an atomic fluorine concentration of between 0.5–15%. Preferably, the fluorine concentration level is between about 0.5–6% SiF and is most preferably between about 1.0–4.0% SiF.

The above process parameters are appropriate for a wafer size of 200 mm. It should be understood by one skilled in the art that all values will scale accordingly for different wafer sizes.

The parameters in all of the above processes should not be considered limiting to the claims. One of ordinary skill in the art could also use other chemicals, chamber parameters, and conditions to produce similar films.

Figure 4A:
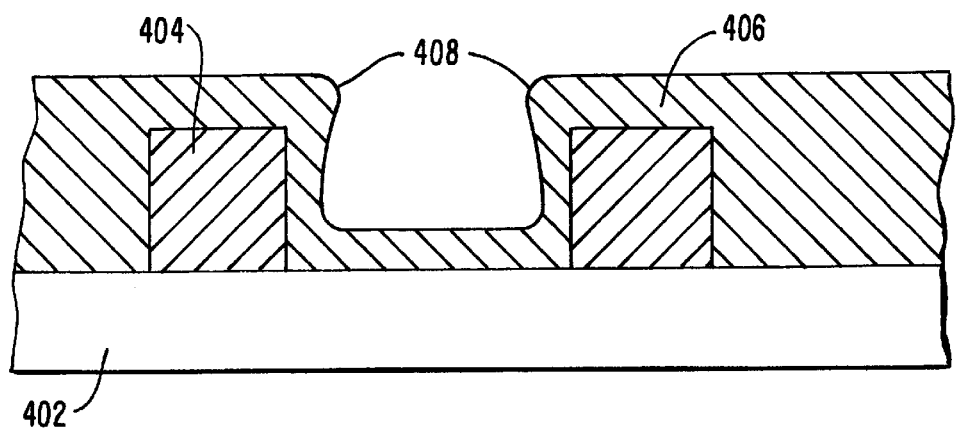
FIG. 4A is a simplified cross-sectional view of a semiconductor device illustrating the deposition of a first insulating layer according to the present invention.

FIG. 4A shows the effects of the initial deposition step on the semiconductor wafer. As in FIG. 2, semiconductor substrate 402 supports a layer of metal conductors 404. Silicon oxide 406 is deposited as an insulating layer over metal conductors 404. The initial layer of silicon oxide 406 is deposited to a point where the silicon oxide layer covers the corners of the metal conductors, but has not become so thick that it cannot be etched away in the succeeding etchback step. Thus, when the initial deposition step is complete, silicon oxide 406 has a profile where the corners 408 extend beyond the upper corners of conductors 404. As discussed in conjunction with FIG. 2, if straight deposition were to be continued in this manner, voids could form in the insulating layer. Therefore, before completing deposition of the dielectric layer, a sputter etchback step is performed.

V. Etchback Step

According to the process of the present invention, the semiconductor substrate next undergoes a sputter etchback step to etch away a portion of the fluorine doped silicon oxide initially deposited over the metal layer. The exemplary etchback step may be performed in the etchback chamber shown in FIG. 1B, for example. In a preferred embodiment, the semiconductor substrate is moved under vacuum seal in the same CVD mainframe from the deposition chamber of the first step to the etchback chamber for the second step of the process. The pressure of the chamber may range from 25 to 100 mtorr. Argon is introduced into the chamber at a rate of 20 to 200 sccm. The sputter etchback step is run for a range of 10 to 300 seconds. By sputtering using argon over the initial FSG deposition layer, some of the deposition layer above the corners of the metal conductors is etched away so that angles are formed in the deposition profile, leading to improved gap fill in the succeeding deposition step. The etch rate is 3.5 to 4 times faster in a direction 45° from the horizontal plane than it is on horizontal surfaces.

Figure 4B:
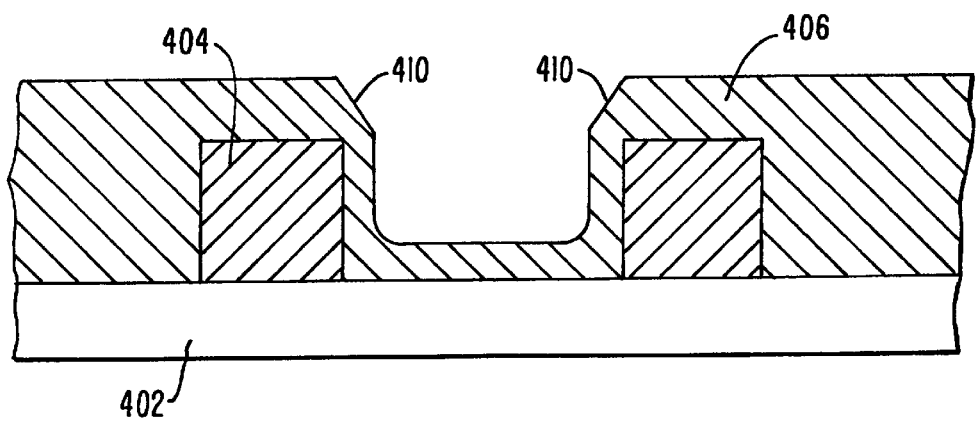
FIG. 4B is a simplified cross-sectional view of a semiconductor device illustrating the effect of the etchback step on the first insulating layer according to the present invention.

FIG. 4B shows the effects of the etchback step on semiconductor substrate 402. Silicon oxide 406 still covers and insulates metal conductors 404. But instead of having a profile conducive to the formation of voids, the etching step has etched away corners 408 (FIG. 4A) to form angled surfaces 410. Now, when the final deposition of silicon oxide is made to complete the dielectric layer over metal conductors 404, the angled surfaces 410 ensure an improved gap fill.

VI. Final FSG Deposition Step

The three step FSG deposition/etchback/FSG deposition process is completed with the final FSG deposition process step. The substrate is moved back to the deposition chamber used for the initial FSG deposition step, and the final FSG deposition step is completed in the same manner as the initial FSG deposition. Therefore, any of the three exemplary FSG deposition methods outlined above, for example, may be used to complete deposition of the insulating layer. The deposition of silicon oxide is continued until the remainder of the insulating layer is complete. In one embodiment, the final FSG deposition step may be followed by the deposition of a capping layer of undoped silicate glass. Once the gaps have been filled, USG can be deposited at a faster rate, speeding up the process to obtain the desired dielectric thickness. Once the gaps are filled, simultaneous etching/deposition is no longer needed. The insulating layer may then be planarized in a known manner, such as, for example, chemical mechanical planarization (CMP). Additional metal conductors are then deposited thereupon to form the next metal layer.

Figure 4C:
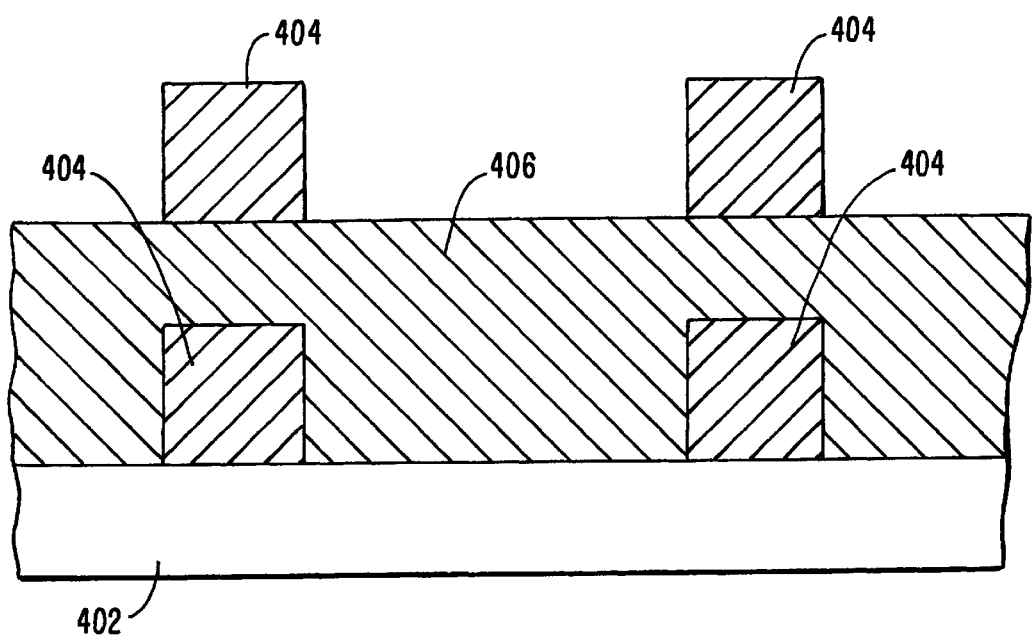
FIG. 4C is a simplified cross-sectional view of a semiconductor device illustrating the completed insulating layer following the second deposition step according to the present invention and an appropriate planarization step.

FIG. 4C shows the completed deposition and planarization of the insulating layer. Silicon oxide 406 completely covers metal conductors 404, allowing for the deposition of additional metal layers 404. Most importantly, the present invention eliminates the formation of voids 210 (FIG. 2) for higher aspect ratios, as discussed in further detail below.

VII. Test Measurements

In one embodiment, the three step FSG deposition/etchback/FSG deposition process of the present invention may be carried out using the following parameters.

In the initial FSG deposition step, the deposition chamber is heated to a temperature of 440° C. and a process gas is introduced into the reaction chamber from the gas distribution manifold. The process gas is a gaseous mixture comprising $SiF_4$ as the gaseous source of fluorine, TEOS as the source of silicon, and one or more gaseous sources of oxygen. The flow rate of TEOS into the injection valve is 915 mgm. After being vaporized, the TEOS gas source is mixed with a helium carrier gas introduced at a rate of 700 sccm. $SiF_4$ is introduced at a flow rate of 450 sccm, while oxygen in the form of $O_2$ is introduced at a rate of 700 sccm. A selected pressure of 5 torr in the reaction chamber is set and maintained throughout deposition. After processing conditions are set, a plasma is formed using a mixed frequency RF power supply. The power supply is driven at a high frequency of 13.56 MHz at 400 Watts and at a low frequency of about 350 KHz at 110 Watts. The initial FSG deposition is carried out for 14 seconds, which deposits an FSG insulating layer of 1000 Å. At this point, the silicon oxide layer covers the corners of the metal conductors, but it has not become so thick that it cannot be etched away in the succeeding etchback step.

In an alternative embodiment, a preliminary liner of undoped silicate glass may be deposited to a depth of 500 Å, followed by the deposition of an FSG layer to a depth of 500 Å, for a total initial deposition of 1000 Å. In this embodiment, the deposition time for the FSG deposition layer is 7 seconds.

Once the initial FSG deposition step is complete, the semiconductor substrate is transferred from the deposition chamber to the etchback chamber. In the sputter etchback step, the pressure of the chamber is set to 25 mtorr, while the power supply is driven at 300–400 Watts, preferably 350 Watts. The chamber walls and the pedestal are at room temperature. Argon is introduced into the chamber at a rate of 50 sccm. The sputter etchback step is carried out for 10–150 seconds, preferably 98 seconds, which results in etching away of 500 Å of the corners of the FSG layer to form angled surfaces, which are less conducive to the formation of voids. Now, when the final deposition of silicon oxide is made to complete the dielectric layer of over the metal conductors, the angled surfaces ensure an improved gap fill.

Once the sputter etchback step is complete, the semiconductor substrate is transferred from the etchback chamber back to the deposition chamber. In the final FSG deposition step, the deposition chamber is heated to a temperature of 440° C. and a process gas is introduced into the reaction chamber from the gas distribution manifold. The process gas is again a gaseous mixture comprising $SiF_4$ as the gaseous source of fluorine, TEOS as the source of silicon, and one or more gaseous sources of oxygen. The flow rate of TEOS into the injection valve is 915 mgm. After being vaporized, the TEOS gas source is mixed with a helium carrier gas introduced at a rate of 700 sccm. $SiF_4$ is introduced at a flow rate of 450 sccm, while oxygen in the form of $O_2$ is introduced at a rate of 700 sccm. A selected pressure of 5 torr in the reaction chamber is set and maintained throughout deposition. After processing conditions are set, a plasma is formed using a mixed frequency RF power supply. The power supply is driven at a high frequency of 13.56 MHz at 400 Watts and at a low frequency of about 350 KHz at 110 Watts. The final FSG deposition is carried out for 77 seconds, which completes the deposition of the insulating layer by depositing an additional 5500 Å of FSG layer over the metal layer.

To complete the insulating layer, a capping layer of undoped silicate glass may be deposited for 109 seconds to a depth of 10,000 Å before the next layer of metal conductors is added to the substrate.

Figure 5:
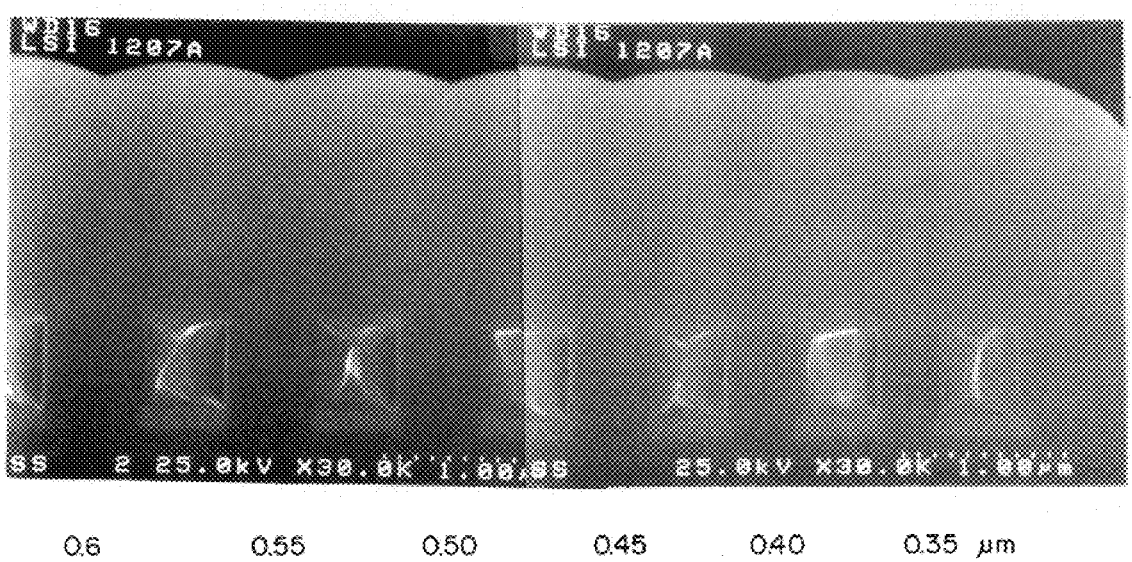
FIG. 5 is a micrograph showing the improved gap filling capabilities offered by the three step FSG deposition/etchback/FSG deposition process of the present invention.

FIG. 5 shows the improvement offered by the three step FSG deposition/etchback/FSG deposition process of the present invention. The figure shown is the result of actual conditions carried out in a testing procedure. As shown in the micrograph, voids do not begin forming until the gap width is as narrow as 0.45 micron, where the typical conductor height is 0.75 micron. Thus, the process of the present invention allows deposition of an insulating layer for higher aspect ratios, such as, for example, approximately 1.67, offering a significant improvement over the prior art methods.

It is possible that a void may result for even smaller gaps with higher aspect ratios. However, with the use of the process of the present invention, the void is limited to a location below the top of the metal conductors, as shown in FIG. 5 for gap widths lower than 0.45 micron. For many microchip applications, however, this may be acceptable since this region is untouched by any further processing. Hence, the three step FSG deposition/etchback/FSG deposition process of the present invention may be applicable for IMD applications even for gap widths smaller than 0.40 micron. Another FSG deposition/etchback/FSG deposition sequence could be added to further reduce the gap size at which voids might appear.

Figure 6:
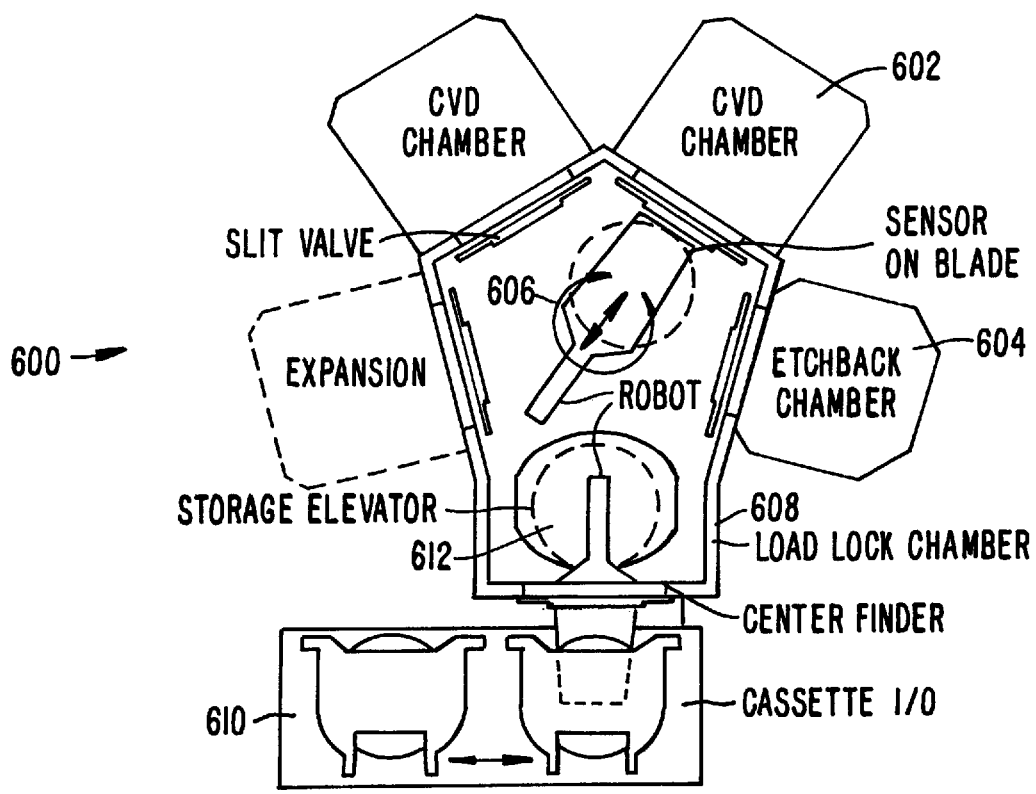
FIG. 6 is a diagram of a multiple chamber system used by the present invention.

FIG. 6 illustrates a processing system 600 in which the present invention can be practiced. A deposition chamber 602 is used for the deposition steps, and an etchback chamber 604 is used for the etching steps. A robot 606 transfers wafers between the chamber in an load lock chamber 608. Wafers are initially provided from a cassette 610, from which they are transferred to a storage elevator 612 in load lock chamber 608. Robot 606 will transfer wafers from storage elevator 612 to deposition chamber 602 for the initial deposition steps. One system having such a configuration is the Precision 5000 System manufactured by Applied Materials.

The present invention has now been explained with reference to specific embodiments. Other embodiments will be apparent to those of ordinary skill in the art. For example, in an alternate embodiment, the deposition chamber and etchback chamber could be located in separate mainframes. It is therefore not intended that this invention be limited except as indicated by the appended claims.

What is claimed is:

1. A process for depositing an intermetal dielectric film on a substrate having a patterned metal layer formed over an upper surface of said substrate, said patterned metal layer including a first and second parallel lines having inner edges that define a gap of 0.45 microns or less in width between said first and second parallel lines, said process comprising:

depositing a first fluorine-doped silicon oxide layer of said intermetal dielectric film over the first and second parallel lines, said first fluorine-doped silicon oxide layer having a bottom portion deposited within said gap, upper portions deposited over said first and second metal lines, and sidewall portions extending from said bottom portion to upper portions, said sidewall portion having corner regions at least partially overhanging said bottom portion;

etching a portion of said first fluorine-doped silicon oxide layer by sputtering said first fluorine-doped silicon oxide layer with an inert gas to remove said overhanging corner regions of the sidewall portion of said first fluorine-doped silicon oxide layer; and depositing a second fluorine-doped silicon oxide layer over said first fluorine-doped silicon oxide layer to fill said gap between said first and second parallel lines.

2. The process of claim 1 wherein said inert gas comprises argon.

3. The process of claim 1 wherein said first and second fluorine-doped silicon oxide layers are deposited by a plasma enhanced chemical vapor deposition process.

4. The process of claim 3 wherein said first and second fluorine-doped silicon oxide layers are deposited by a plasma formed from a process gas comprising $SiF_4$, TEOS and oxygen.

5. The process of claim 3 wherein said first and second fluorine-doped silicon oxide layers are deposited by a plasma formed from a process gas comprising TEFS, TEOS and oxygen.

6. The process of claim 3 wherein said first and second fluorine-doped silicon oxide layers are deposited by a plasma formed from a process gas comprising $C_2F_6$, TEOS and oxygen.

7. The process of claim 3 wherein said first and second fluorine-doped silicon oxide layers are deposited at a temperature of between 200–500° C. and at a pressure of between 1–100 torr.

8. The process of claim 1 further comprising, prior to depositing said first fluorine-doped silicon oxide layer, depositing an initial silicon oxide layer without a fluorine dopant.

9. The process of claim 8 wherein said initial silicon oxide layer is deposited to a depth of 100–500 Å.

10. The process of claim 1 wherein said etching step is carried out for 10–150 seconds.

11. The process of claim 1 wherein said first fluorine-doped silicon oxide layer is deposited to a depth of less than one-half of the average depth of intermetal gaps on said substrate.

12. The process of claim 1 further comprising the step of depositing a film of undoped silicate glass (USG) which is thicker than said first and second fluorine-doped silicon oxide layers to complete formation of said intermetal dielectric film.

13. A method of manufacturing integrated circuits, said method comprising:

forming a layer of patterned metal conductors on a semiconductor substrate, said patterned metal layer including a first and second parallel lines having inner edges that define a gap of 0.45 microns or less in width between said first and second parallel lines;

placing said semiconductor substrate in a first substrate processing chamber;

depositing a first fluorine-doped silicon oxide layer of said intermetal dielectric film over the first and second parallel lines, said first fluorine-doped silicon oxide layer having a bottom portion deposited within said gap, upper portions deposited over said first and second metal lines, and sidewall portions extending from said bottom portion to upper portions, said sidewall portions having corner regions at least partially overhanging said bottom portion;

transferring said semiconductor substrate from said first chamber to a second substrate processing chamber;

etching portion of said first fluorine-doped silicon oxide layer by sputtering said layer with an inert gas to remove said overhanging corner regions of the sidewall portions of said first fluorine-doped silixon oxide layer;

moving said semiconductor substrate from said second chamber to said first chamber; and depositing a second fluorine-doped silicon oxide layer over said first fluorine-doped silicon oxide layer to fill said gap between said first and second parallel lines.

14. The method of claim 13 wherein said inert gas comprises argon.

15. The method of claim 13 wherein said first and second fluorine-doped silicon oxide layers are deposited by a plasma enhanced chemical vapor deposition process.

16. The method of claim 15 wherein said first and second fluorine-doped silicon oxide layers are deposited by a plasma formed from a process gas comprising $SiF_4$, TEOS and oxygen.

17. The method of claim 15 wherein said first and second fluorine-doped silicon oxide layers are deposited by a plasma formed from a process gas comprising TEFS, TEOS and oxygen.

18. The method of claim 15 wherein said first and second fluorine-doped silicon oxide layers are deposited by a plasma formed from a process gas comprising $C_2F_6$, TEOS and oxygen.

19. The method of claim 15 wherein said first and second fluorine-doped silicon oxide layers are deposited at a temperature of between 200–5000° C. and at a pressure of between 1–100 torr.

* * * * *